US 6,917,229 B2

(12) United States Patent  
Cho

(10) Patent No.: US 6,917,229 B2
(45) Date of Patent: Jul. 12, 2005

(54) DELAY LOCKED LOOP HAVING LOW JITTER IN SEMICONDUCTOR DEVICE

(75) Inventor: Seong-Ik Cho, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/636,818

(22) Filed: Aug. 7, 2003

(65) Prior Publication Data

US 2004/0100313 A1 May 27, 2004

(30) Foreign Application Priority Data

Nov. 27, 2002 (KR) ................................ 10-2002-0074233

(51) Int. Cl.[7] ................................................. H03L 7/06
(52) U.S. Cl. ...................... 327/158; 327/161; 375/376
(58) Field of Search ............................... 327/147–153, 327/156–163; 375/373–376; 331/1 A, DIG. 2

(56) References Cited

U.S. PATENT DOCUMENTS

| 5,260,979 | A | * | 11/1993 | Parker et al. ............... 375/366 |
| 6,069,506 | A | | 5/2000 | Miller, Jr. et al. .......... 327/156 |
| 6,069,507 | A | * | 5/2000 | Shen et al. ................. 327/156 |
| 6,101,197 | A | | 8/2000 | Keeth et al. ................ 370/517 |
| 6,130,552 | A | | 10/2000 | Jefferson et al. ............. 326/39 |
| 6,137,328 | A | | 10/2000 | Sung ......................... 327/158 |
| 6,242,954 | B1 | * | 6/2001 | Taniguchi et al. ........... 327/149 |
| 6,316,976 | B1 | | 11/2001 | Miller, Jr. et al. .......... 327/156 |
| 6,346,839 | B1 | | 2/2002 | Mnich ........................ 327/158 |
| 6,366,148 | B1 | | 4/2002 | Kim ........................... 327/262 |
| 6,452,432 | B2 | | 9/2002 | Kim ........................... 327/158 |
| 6,489,823 | B2 | | 12/2002 | Iwamoto ..................... 327/158 |
| 6,490,224 | B2 | | 12/2002 | Manning ..................... 365/233 |
| 6,518,807 | B1 | * | 2/2003 | Cho ........................... 327/158 |
| 6,703,879 | B2 | * | 3/2004 | Okuda et al. ................ 327/158 |

* cited by examiner

Primary Examiner—Minh Nguyen
(74) Attorney, Agent, or Firm—Blakely Sokoloff Taylor & Zafman

(57) ABSTRACT

A DLL circuit having a low jitter in a semiconductor device, includes a delay model unit for compensating a time difference between an external clock signal and an internal clock signals and generating a compensation signal; an input buffer for receiving a reference clock signal and an inverted clock signal, and for outputting a clock signal and an inverted clock signal activated at each edges of the reference clock signal and the inverted clock signal; a phase detection unit for generating a comparison signal by comparing the compensation signal with the inverted clock signal, and for outputting the comparison signal with a normal mode or a fast mode; a control unit for generating a plurality of control signals by receiving the comparison signal, the inverted clock signal and the clock signal; a delay unit for delaying in response to the plurality of control signals; and an output buffer for outputting a delayed clock signal by receiving an output signal of the duty corrector.

4 Claims, 2 Drawing Sheets

DELAY LOCKED LOOP HAVING LOW JITTER IN SEMICONDUCTOR DEVICE

FIELD OF THE INVENTION

The present invention relates to a semiconductor device; and, more particularly, to a delay locked loop circuit having a low jitter by using a digital phase mixer in the semiconductor device.

DESCRIPTION OF RELATED ART

Generally, a clock signal is employed to set a timing reference and secure a rapid operation without any error in a system or a circuit. At this time, a time delay is generated when the clock signal provided from the external circuit is used in an internal circuit. The time delay is adjusted by using a delay locked loop (DLL) circuit to synchronize the phase of the external clock signal with that of the internal clock signal.

FIG. 1 is a block diagram showing a conventional DLL circuit. The conventional DLL circuit includes a delay model unit 110, a phase detector 120, a counter and decoder 130 and a digital delay line 140. The delay model unit 110 is used to compensate a time difference between an external clock signal and an internal clock signal, and generate a compensation signal Fbclk and the phase detector 120 compares the compensation signal Fbclk with an external clock signal Clock and generates a comparison signal. The counter and decoder 130 generates a control signal for adjusting amount of delay according to the comparison signal outputted from the phase detector 120. The digital delay line 140 delays the external clock signal Clock according to the control signal from the counter and decoder 130.

In the conventional DLL circuit, since one cycle delay line is required to cover a clock frequency to be used in a system, there is a problem that the delay is sensitively varied according to a noise. Also, since the DLL circuit is structured with the one cycle delay line, power consumption and area are increased and, after delay is locked, there is a problem that a jitter may be increased due to a noise of a unit delay in the delay line 140.

SUMMARY OF THE INVENTION

It is, therefore, an object of the present invention to provide a delay locked loop (DLL) circuit reducing a jitter by using a digital phase mixer for mixing signals outputted from two delay lines.

In accordance with an aspect of the present invention, there is provided a DLL circuit having a low jitter, including: a delay model unit for compensating a time difference between an external clock signal and an internal clock signals and generating a compensation signal; an input buffer for receiving a reference clock signal and an inverted clock signal, and for outputting a clock signal and an inverted clock signal activated at each edges of the reference clock signal and the inverted clock signal; a phase detection unit for generating a comparison signal by comparing the compensation signal with the inverted clock signal, and for outputting the comparison signal with a normal mode or a fast mode; a control unit for generating a plurality of control signals by receiving the comparison signal, the inverted clock signal and the clock signal; a delay unit for delaying in response to the plurality of control signals; and an output buffer for outputting a delayed clock signal by receiving an output signal of the duty corrector.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a delay locked loop (DLL) circuit having a low jitter by using a digital phase mixer for mixing signals outputted from two delay lines an according to the present invention will be described in detail referring to the accompanying drawings.

Figure 1:
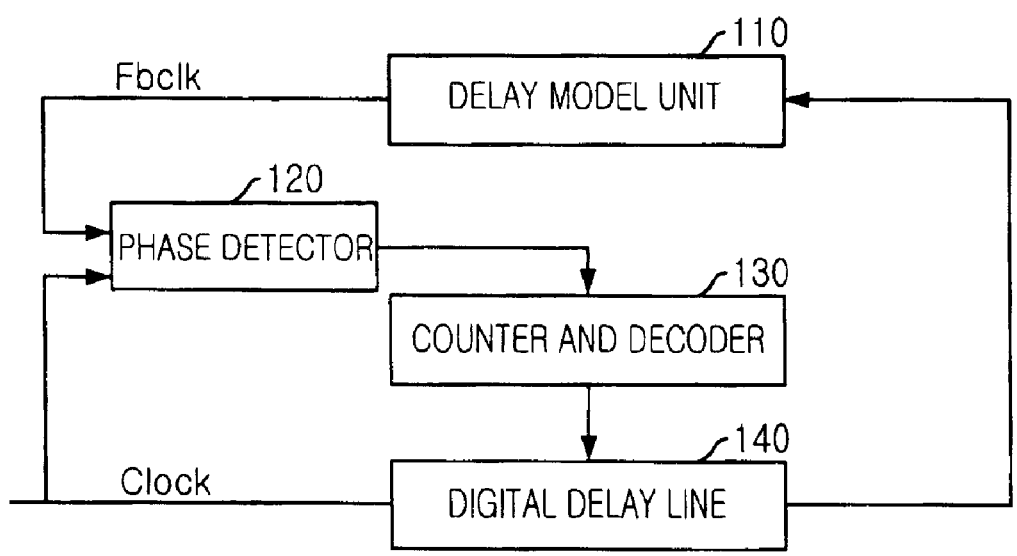
FIG. 1 is a block diagram showing a conventional DLL circuit.
Figure 2:
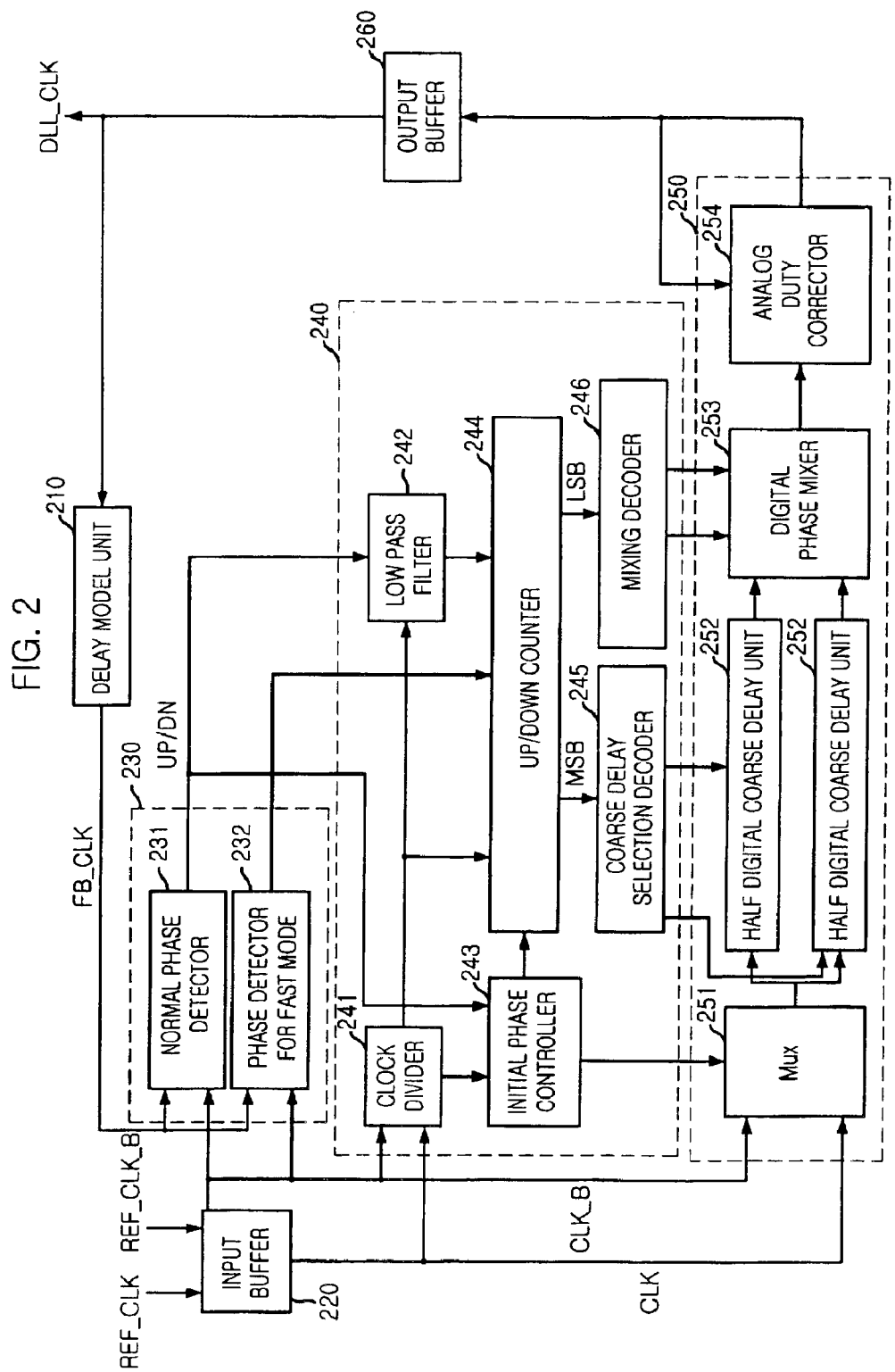
FIG. 2 is a block diagram illustrating a low jitter DLL circuit having a digital phase mixer in accordance with the preferred embodiment of the present invention.

FIG. 2 is a block diagram illustrating a low jitter DLL circuit having a digital phase mixer in accordance with the preferred embodiment of the present invention. The DLL circuit includes a delay model unit 210, an input buffer 220, a phase detector 230, a controller 240 and a delay line unit 250.

The delay model unit 210 is used for compensating a time difference between a clock signal inputted from an external circuit and an internal clock signal substantially used in the system and outputs a compensation signal FB_CLK, and the compensation signal is inputted to the phase detector 230.

Also, the input buffer 220 receives a reference clock signal REF CLK and an inverted reference clock signal REF CLK B and generates a dock signal CLK and an inverted clock signal CLKB activated at a rising edge of the reference clock signal and the inverted reference clock signal REF CLK B. The clock signal is inputted to the controller 240 and the delay line unit 250.

A normal phase detector 231 included in the phase detector 230 compares the compensation signal outputted from the delay model unit 210 with the inverted clock signal CLK_B, and generates a comparison signal UP/DN to thereby determine a count up/down mode. The comparison signal UP/DN is inputted to a low pass filter 242 and an initial phase control unit 243 included in the controller 240. A phase detector for a fast mode 232 included in the phase detector 230 compares the compensation signal outputted from the delay model unit 210 with the inverted clock signal CLK_B outputted from the input buffer 220. When a phase difference between the compensation signal and with the inverted clock signal CLK_B is over amount of a delay of the unit delay, the comparison signal UP/DN is generated. The comparison signal UP/DN is outputted to an up/down counter 244 included in the controller 240.

The controller 240 receives the comparison signal UP/DN outputted from the phase detector 230 and the clock signal CLK and the inverted clock signal CLK_B, and outputs a plurality of control signals for controlling a delay in response to the comparison signal UP/DN. The control signals are outputted to the delay unit 250.

Hereinafter, an operation of the controller 240 will be described. A clock divider 241 included in the controller 240 receives the inverted clock signal CLK_B and the clock signal from the input buffer 220, and divides the inverted clock signal CLK_B and the clock signal CLK. The divided clock signals are outputted to the low pass filter 240, the initial phase control unit 243 and the up/down counter 244. The reason for dividing the inverted clock signal CLK_B and the clock signal CLK is to have a time delay capable of compensating a delay due to the comparison signal UP/DN in the phase detector 230.

The low pass filter 242 included in the controller 240 receives the comparison signal UP/DN from the phase detector 230 and an output signal from the clock divider 241.

The initial phase control unit 243 in the controller 240 receives the output signal from the clock divider 241 and the comparison signal UP/DN from the phase detector 230, and, when a current state is determined as an initial state in response to the above signals, outputs an inverted clock selection signal and an enable signal to the delay unit 250 and the up/down counter 244, otherwise, outputs a clock selection signal to the delay unit 250.

An operation of the up/down counter 244 is started when the enable signal is received from the initial phase control unit 243, and receives an output signal from the controller 243, the comparison signal outputted from the phase detecting unit 230 and an output signal of the low pass filter 242. The up/down counter 244 generates a most significant bit (MSB) signal by counting the comparison signal outputted from the phase detector for fast mode 232 and a least significant bit (LSB) signal by counting the output signal of the low pass filter. The MSB signal is inputted to the coarse delay selection decoder 245 and the LSB signal is inputted to the mixing decoder 246.

The coarse delay selection decoder included in the controller 240 generates a delay control signal for amount of delay by receiving the MSB signal from the up/down counter 244, and the delay control signal is inputted to the delay unit 250.

A mixing decoder 246 in the control unit 240 generates a mixing control signal for controlling a phase mixing operation by receiving the LSB signal from the low pass filter 242. The mixing control signal is inputted to the delay unit 250.

The delay unit 250 includes a multiplexer (MUX) 251, half digital coarse delay units 252, a digital phase mixer 253 and an analog duty corrector 254. The delay unit 25 delays the inverted clock signal and the clock signal according to the control signals outputted from the control unit 240, mixes the delayed clock signals according to the mixing control signal and performs a duty correction operation for an output signal of the digital phase mixer 253.

The MUX 251 transmits the inverted clock signal CLK_B to the half digital coarse delay units 252 when the inverted clock selection signal is inputted therein and transmits the clock signal CLK to the half digital coarse delay units 252 when the clock selection signal is inputted therein.

Two half coarse delay lines 252, which one of half coarse delay line has a delay difference with another half coarse delay line, receives the delay control signal and the inverted clock signal CLK_B or the clock signal CLK from the MUX 251, and delays the inverted clock signal CLK_B or the clock signal CLK according to the delay control signal outputted from the coarse delay selection decoder 245. The two delayed signals are inputted to the digital phase mixer 253.

The digital phase mixer receives the mixing control signal and two delayed clock signals from the two half coarse delay lines, and mixes two delayed clock signals to have a fine delay according to the mixing control signals. An output signal of the digital phase mixer 253 is inputted to the analog duty corrector 254. The duty corrector performs a duty correction operation for the output signal of the digital phase mixer through a feedback process.

The output buffer 260 receives the output signal of the analog duty corrector 254 and outputs a delayed clock signal DLL CLK by buffering the output signal.

An operation of the DLL circuit having a low jitter will be described in accordance with the present invention.

After the clock signal CLK and the inverted dock signal CLK_B is generated by receiving the reference dock signal and the inverted dock signal REF CLK B in the input buffer 220, the phase detecting unit 230 compares the compensation signal FB_CLK outputted from the delay model unit 210 and the inverted clock signal CLK_B from the input buffer 220 to thereby generate the comparison signal UP/DN. The normal phase detector 231 compares the compensation signal FB_CLK and the inverted clock signal CLRB and generates a first comparison signal UP/DN. The first comparison signal UP/DN is inputted to the low pass filter 242 and the initial phase control unit 243. The phase detector for fast mode 232 compares the compensation signal FB_CLK and the inverted clock signal CLK_B and generates a second comparison signal to the up/down counter 144 in the control unit 240 when a delay difference between the compensation signal FB_CLK and the inverted clock signal CLK_B is over amount of a delay of one unit delay.

Subsequently, the initial phase controller 243 receives the output signal of the clock divider 241 and the first comparison signal from the phase detecting unit 230, and generates the inverted clock selection signal and the enable signal when the current state corresponds to the initial state determined according to the output signal of the clock divider 241 and the first comparison signal from the phase detecting unit 230, or the clock selection signal when the current state is not an initial state to the delay unit 250.

The MUX 251 transmits the inverted clock signal CLK_B to the half digital coarse delay units 252 when the inverted clock selection signal is inputted therein, and transmits the clock signal CLK to the half digital coarse delay units 252 when the clock selection signal is inputted therein. Two half coarse delay lines 252 receives the delay control signal and the inverted clock signal CLK_B or the clock signal CLK from the MUX 251, and delays the inverted clock signal CLK_B or the clock signal CLK according to the delay control signal outputted from the coarse delay selection decoder 245. The two delayed signals are inputted to the digital phase mixer 253.

The digital phase mixer receives the mixing control signal and two delayed clock signals from the two half coarse delay lines, and mixes two delayed clock signals to have a fine delay according to the mixing control signals. An output signal of the digital phase mixer 253 is inputted to the analog duty corrector 254. The duty corrector performs a duty correction operation for the output signal of the digital phase mixer through a feedback process.

Since the initial phase control unit is employed in the DLL circuit in accordance with present invention, a half delay line is required for a frequency to be used in the DLL. Also, two delay lines having a delay difference as much as amount of delay of one unit delay each other is used to reduce a jitter by mixing the output signals of two delay lines.

While the present invention has been described with respect to the particular embodiments, it will be apparent to those skilled in the art that various changes and modifications may be made without departing from the spirit and scope of the invention as defined in the following claims.

What is claimed is:

1. A DLL circuit having a low jitter, comprising:
   a delay model unit for compensating a time difference between a reference clock signal and a delayed clock signal, and generating a compensation signal;
   an input buffer for receiving the reference clock signal and an inverted reference clock signal in order to output a clock signal and an inverted clock signal by respectively buffering the reference clock signal and the inverted reference clock signal;
   a phase detection unit for generating a comparison signal based on a delay difference between the compensation signal and the inverted clock signal according to an operating mode;
   a control unit for generating a plurality of control signals based on the comparison signal, the inverted clock signal and the clock signal;
   a delay unit for delaying the clock signal and the inverted dock signal and for performing a duty correction in response to the plurality of control signals; and
   an output buffer for outputting the delayed dock signal by buffering an output signal of the delay unit,
   wherein one of a normal mode and a fast mode is selected as the operating mode based on a result of comparing a delay amount of one unit delay included in the delay unit with the delay difference.

2. The DLL circuit as recited in claim 1, wherein the phase detection unit includes:
   a normal phase detector for comparing the compensation signal and the inverted dock signal and for outputting a first comparison signal to the control unit; and
   a phase detector for the fast mode for comparing the compensation signal and the inverted clock signal and for outputting a second comparison signal to the control unit when delay difference between the compensation signal and the inverted clock signal is over than the delay amount of one unit delay.

3. The DLL circuit as recited in claim 2, wherein the control unit includes:
   a clock divider for receiving the inverted clock signal and the clock signal, and for dividing the inverted clock signal and the dock signal;
   a low pass filter for receiving the first comparison signal and an output signal of the clock divider;
   an initial phase controller for receiving the output signal of the clock divider and the first comparison signal, and for outputting an inverted clock selection signal and an enable signal when a current state is an initial state determined according to the output signal of the clock divider and the first comparison signal, and for outputting a clock selection signal when the current state is not an initial state;
   an up/down counter, which is operated by receiving the enable signal, receiving the output signal of the clock divider, the second comparison signal and an output signal of the low pass filter, and for generating a most significant bit (MSB) signal by counting the second comparison signal and a least significant bit (LSB) signal by counting the output signal of the low pass filter;
   a coarse delay selection decoder for receiving the MSB signal and generating a delay control signal to adjust amount of delay of the delay unit according to the MSB signal; and
   a mixing decoder for receiving the LSB signal and for generating a phase mixing control signal to the delay unit according to the LSB signal.

4. The DLL circuit as recited in claim 3, wherein the delay unit includes:
   a multiplexer (MUX) for selecting the inverted clock signal when the inverted clock selection signal is inputted therein and for selecting the dock signal when the clock selection signal is inputted therein;
   two half coarse delay lines receiving the delay control signal and the inverted clock signal or the clock signal from the MUX, and for delaying the inverted clock signal or the clock signal according to the delay control signal;
   a digital phase mixer for receiving the phase mixing control signal and two delayed clock signals from the two half coarse delay lines, and mixing the two delayed clock signals to have a fine delay according to the phase mixing control signal; and
   a duty corrector for performing the duty correction for an output signal of the digital phase mixer through a feedback process.

* * * * *